United States Patent
Oyama

(10) Patent No.: US 10,950,723 B2
(45) Date of Patent: Mar. 16, 2021

(54) SEMICONDUCTOR DEVICE AND CIRCUIT HAVING THE SAME

(71) Applicant: DENSO CORPORATION, Kariya (JP)

(72) Inventor: Kazuhiro Oyama, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/068,919

(22) PCT Filed: Nov. 17, 2016

(86) PCT No.: PCT/JP2016/084094
§ 371 (c)(1),
(2) Date: Jul. 10, 2018

(87) PCT Pub. No.: WO2017/134900
PCT Pub. Date: Aug. 10, 2017

(65) Prior Publication Data
US 2019/0027598 A1 Jan. 24, 2019

(30) Foreign Application Priority Data

Feb. 5, 2016 (JP) .............................. JP2016-020942

(51) Int. Cl.
*H01L 29/78* (2006.01)
*H01L 29/51* (2006.01)
*H01L 29/423* (2006.01)
*H01L 27/04* (2006.01)
(Continued)

(52) U.S. Cl.
CPC .......... *H01L 29/7827* (2013.01); *H01L 27/04* (2013.01); *H01L 29/1602* (2013.01);
(Continued)

(58) Field of Classification Search
CPC ............. H01L 29/7827; H01L 29/1602; H01L 29/423; H01L 29/4908; H01L 29/7813;
(Continued)

(56) References Cited

U.S. PATENT DOCUMENTS

| 2007/0188152 A1* | 8/2007 | Asada ..................... H02J 7/245 322/37 |
| 2009/0104762 A1* | 4/2009 | Kusumoto .......... H01L 21/0475 438/530 |

(Continued)

OTHER PUBLICATIONS

Proceedings of the 60th Annual Meeting of the Japan Society of Applied Physics (Spring 2013, Kanagawa Institute of Technology), 27p-G22-4, Development of Low On-Resistance SiC Trench Power MOSFET, Development of SiC Trench MOSFET with Ultra Low ON Resistance, written by Takashi Nakamura, Yuki Nakano, Toshio Hanada of Rohm Co., Ltd. (with English translation)(discussed on p. 1-2 of the specification).

*Primary Examiner* — Patricia D Reddington
(74) *Attorney, Agent, or Firm* — Posz Law Group, PLC

(57) ABSTRACT

In a semiconductor device with a wide gap semiconductor, a gate insulating film is made of a material having a barrier against a minor carrier in an n-type body layer and having no barrier against a minor carrier in a p-type drift layer. As a result, in the semiconductor device with the wide gap semiconductor, a reduction in a conduction loss can be achieved while realizing an improvement in blocking resistance and securing reliability of the gate insulating film.

12 Claims, 4 Drawing Sheets

(51) Int. Cl.
   *H01L 29/16* (2006.01)
   *H01L 29/49* (2006.01)
   *H01L 29/10* (2006.01)
   *H01L 29/417* (2006.01)

(52) U.S. Cl.
   CPC ........ *H01L 29/423* (2013.01); *H01L 29/4908* (2013.01); *H01L 29/51* (2013.01); *H01L 29/7813* (2013.01); *H01L 29/1095* (2013.01); *H01L 29/1608* (2013.01); *H01L 29/41766* (2013.01); *H01L 29/4236* (2013.01); *H01L 29/42368* (2013.01); *H01L 29/513* (2013.01)

(58) Field of Classification Search
   CPC ................. H01L 27/04; H01L 29/4236; H01L 29/42368
   See application file for complete search history.

(56) References Cited

U.S. PATENT DOCUMENTS

| | | | |
|---|---|---|---|
| 2010/0041195 A1* | 2/2010 | Harris | H01L 29/41766 438/268 |
| 2010/0078707 A1 | 4/2010 | Haeberlen et al. | |
| 2010/0301410 A1 | 12/2010 | Hirler | |
| 2012/0182051 A1* | 7/2012 | Aoki | H01L 27/0255 327/109 |
| 2013/0313576 A1* | 11/2013 | Nakano | H01L 29/8611 257/77 |
| 2015/0069504 A1* | 3/2015 | Nozu | H01L 29/42368 257/331 |
| 2016/0035739 A1* | 2/2016 | Saito | H01L 29/788 438/591 |

* cited by examiner

SEMICONDUCTOR DEVICE AND CIRCUIT HAVING THE SAME

CROSS REFERENCE TO RELATED APPLICATION

This application is a U.S. national stage application of International Application No. PCT/JP2016/084094 filed on Nov. 17, 2016 and is based on Japanese Patent Application No. 2016-20942 filed on Feb. 5, 2016, the disclosures of which are incorporated herein by reference.

TECHNICAL FIELD

The present disclosure relates to a semiconductor device using a wide gap semiconductor such as diamond, for example.

BACKGROUND

Up to now, as a semiconductor device including an MISFET made of a wide gap semiconductor, for example, a semiconductor device having a vertical MISFET of an inverted trench gate structure has been known (refer to, for example, Non Patent Literature 1).

The vertical MISFET has a configuration shown in FIG. 6, for example. Specifically, an n-type drift layer J2 and a p-type body layer J3 are formed on an n$^+$-type substrate J1 in order, and a p-type deep layer J5 is formed below the p-type body layer J3 so as to sandwich a trench gate structure. An n$^+$-type source region J6 is formed in a surface layer portion of the p-type body layer J3 and a trench J7 is formed so as to penetrate through the n$^+$-type source region J6 and the p-type body layer J3. A gate electrode J9 is disposed over a surface of the trench J7 across a gate insulating film J8, to thereby form a trench gate structure. A source electrode J10 is provided on a front surface side of the n$^+$-type substrate J1 or the like. The source electrode J10 is electrically connected to the n$^+$-type source region J6 or the like. A drain electrode J11 is provided on a back surface side of the n$^+$-type substrate J1. The drain electrode J11 is electrically connected to the n$^+$-type substrate J1. With the structure described above, a vertical MISFET having the trench gate structure is configured.

A total resistance value $R_{TOTAL}$ of on-resistances of the vertical MISFET configured as described above is a sum of the resistance values of resistance components of the respective portions as a current path of the vertical MISFET and is expressed by the following expression. Incidentally, $R_{SC}$ is a contact resistance between the source electrode J10 and the n$^+$-type source region J6. RS is an internal resistance of the n$^+$-type source region J6. $R_{CH}$ is a channel resistance in a channel region formed in the p-type body layer J3. The $R_{JFET}$ is a JFET resistance in a JFET portion which is formed between the p-type deep layer J5. $R_{DRIFT}$ is an internal resistance of the n-type drift layer J2, that is, a drift resistance. $R_{SUB}$ is an internal resistance of the n$^+$-type substrate J1. $R_{DC}$ is a contact resistance between the n$^+$-type substrate J1 and the drain electrode J11.

$$R_{TOTAL} = R_{SC} + R_S + R_{CH} + R_{JFET} + R_{DRIFT} + R_{SUB} + R_{DC} \quad \text{(Expression 1)}$$

NON PATENT LITERATURE

Non-Patent Literature 1: Proceedings of the 60th Annual Meeting of the Japan Society of Applied Physics (Spring in 2013, Kanagawa Institute of Technology), 27p-G22-4, Development of Low On-Resistance SiC Trench Power MOSFET, Development of SiC Trench MOSFET with Ultra Low ON Resistance, written by Takashi Nakamura, Yuki Nakano, Toshio Hanada of Rohm Co., Ltd.

SUMMARY

In the vertical MISFET made of the wide gap semiconductor described above, the deep p-type deep layer J5 is formed on both sides of the trench gate in order to secure the reliability of the gate insulating film and to improve a short circuit resistance and a blocking resistance.

More specifically, if the p-type deep layer J5 is formed deeper than the trench gate structure, since an electric field can be assigned to a PN junction between the p-type deep layer J5 and the n-type drift layer J2 in a blocking state, an electric field intensity of the gate insulating film J8 can be weakened accordingly. In other words, the p-type deep layer J5 can prevent a high electric field from entering a bottom portion of the trench gate structure. As a result, the high electric field is prevented from being applied to the gate insulating film J8, thereby being capable of securing the reliability of the gate insulating film J8.

In the case where the electric field in the vicinity of the gate insulating film J8 is intensified to cause avalanche breakdown, generated holes flow into the p-type body layer J3 below the n$^+$-type source region J6 and then enter the source electrode J10. For that reason, a positive bias is applied to the PN junction of a built-in diode formed by the p-type body layer J3 and the n-type drift layer J2 based on a voltage drop caused by an internal resistance of the p-type body layer J3 to turn on a parasitic PNP transistor. When the transistor is turned on once, a positive feedback is effected, and a current concentrates at a portion that has been turned on, resulting in breakdown. Also, when a position at which the electric field is strong becomes the PN junction of the built-in diode, an avalanche generation point moves to the PN junction. Therefore, since the holes do not pass below the n$^+$-type source region J6 but directly enter the source electrode J10, the parasitic PNP transistor is not turned on. This makes it possible to improve the blocking resistance and an L load resistance of the vertical MISFET. Furthermore, even at the time of recovering the built-in diode, since the holes accumulated in the n-type drift layer J2 directly enter the source electrode J10 without passing below the n$^+$-type source region J6, the vertical MISFET is not erroneously turned on. This also makes it possible to improve a recovery resistance of the vertical MISFET.

However, since a width for forming the deep p-type deep layer J5 is required in the first place, a unit cell size cannot be reduced as compared with a case in which there is no p-type deep layer J5. Therefore, the channel width $W_{CH}$ cannot be increased and the channel resistance $R_{CH}$ cannot be reduced. Furthermore, the JFET formed by the PN junction of the p-type deep layer J5 and the n-type drift layer J2 is parasitically formed. Therefore, when an interval of the p-type deep layer J5 is narrowed, the JFET resistance $R_{JFET}$ becomes large. Therefore, since the interval of the p-type deep layer J5 cannot be narrowed, the cell size does not become small and the channel resistance $R_{CH}$ cannot be reduced. In other words, a lower limit value of the total resistance value $R_{TOTAL}$ which determines a conduction loss is limited.

It is a first object of the present disclosure to provide a reduction in a conduction loss while realizing an improvement in blocking resistance in a semiconductor device using a wide gap semiconductor. It is a second object of the present disclosure to improve the reliability of a gate insulating film of an MISFET.

According to one aspect of the present disclosure, a semiconductor device includes a vertical MISFET having: a semiconductor substrate that includes a back surface layer having a first conductivity type, arranged on a back surface side, and made of a wide gap semiconductor with a high impurity concentration and a drift layer having the first conductivity type, arranged on a front surface side, and made of the wide gap semiconductor having a lower impurity concentration than the back surface layer; a body layer having a second conductivity type, arranged over the drift layer, and made of the wide gap semiconductor; a source region having the first conductivity type, arranged in an upper layer portion of the body layer, and made of the wide gap semiconductor having a higher impurity concentration than the drift layer; a trench gate structure that is arranged in a trench disposed from a surface of the source region to a depth deeper than the body layer, and includes a gate insulating film arranged on an inner wall surface of the trench and a gate electrode arranged on the gate insulating film; a source electrode that is electrically connected to the source region; and a drain electrode that is electrically connected to the back surface layer of the semiconductor substrate on the back surface side. The gate insulating film is made of a material having a barrier against a minor carrier in the body layer and having no barrier against the minor carrier in the drift layer.

As described above, the gate insulating film is made of the material having the barrier against the minority carriers of the body layer and having no barrier against the minority carriers of the drift layer. As a result, in the semiconductor device using the wide gap semiconductor, a reduction in a conduction loss can be performed while realizing an improvement in blocking resistance.

Further, in the semiconductor device according to the above aspect of the present disclosure, the gate insulating film can be made of a material having a dielectric constant higher than that of the wide gap semiconductor.

With the configuration described above, an electric field intensity in the gate insulating film is reduced during an off-state. For that reason, the reliability of the gate insulating film can be improved.

EMBODIMENTS

Hereinafter, embodiments of the present disclosure will be described below with reference to the drawings. In the following respective embodiments, parts identical with or equivalent to each other are denoted by the same symbols for description.

First Embodiment

A first embodiment will be described. In the present embodiment, as a semiconductor device having a MISFET of a trench gate structure using a wide gap semiconductor, a semiconductor device having an inverted vertical MISFET will be described as an example.

Figure 1:
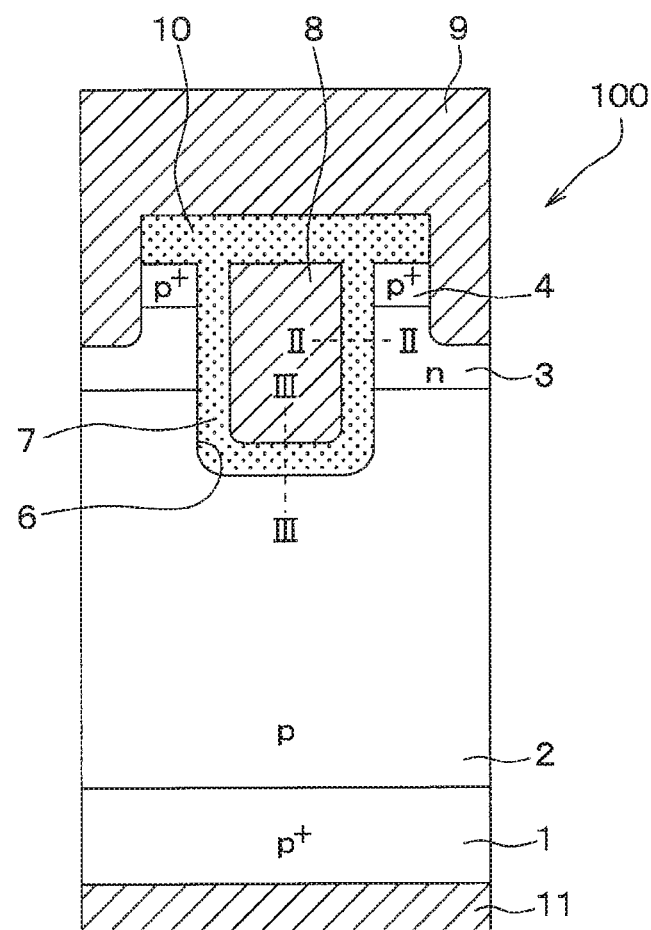
FIG. 1 is a cross-sectional view of a semiconductor device made of a wide gap semiconductor according to a first embodiment.

The semiconductor device shown in FIG. 1 is made of diamond as the wide gap semiconductor, and structured such that a vertical MISFET 100 having a trench gate structure is formed in a cell region in a semiconductor chip.

The semiconductor device is formed with the use of a semiconductor substrate in which a p-type drift layer 2 made of p-type diamond having a lower impurity concentration than that of a $p^+$-type substrate 1 is formed on a front surface side of the $p^-$-type substrate 1 made of p-type diamond having a high impurity concentration.

An n-type body layer 3 is formed in an upper layer portion of the p-type drift layer 2. In the present embodiment, the n-type body layer 3 is made of n-type diamond having a higher impurity concentration than that of the p-type drift layer 2. The n-type body layer 3 is formed on the p-type drift layer 2 which is a flat surface or is formed by ion-implanting an n-type impurity into the surface layer portion of the p-type drift layer 2.

Further, a $p^+$-type source region 4 is formed in an upper layer portion of the n-type body layer 3. The $p^+$-type source region 4 is also formed on the n-type body layer 3 which is a flat surface or is formed by ion-implanting a p-type impurity into the surface layer portion of the n-type body layer 3.

In the cross section of FIG. 1, the $p^+$-type source region 4 is disposed on both sides of the trench gate structure which will be described later. Similarly, the n-type body layer 3 is also disposed on both sides of the trench gate structure in the cross section of FIG. 1. In the present embodiment, the n-type body layer 3 is used also as a contact region to be electrically connected to a source electrode 9 which will be described later. Alternatively, a contact region having a high concentration may be provided partially in a portion of the n-type body layer 3 which is in contact with the source electrode 9, separately.

A trench 6 is formed to reach the p-type drift layer 2 through the n-type body layer 3 and the $p^+$-type source region 4 with a direction perpendicular to a paper plane as a longitudinal direction of the trench 6. The n-type body layer 3 and the $p^+$-type source region 4 described above are disposed to come in contact with side surfaces of the trench 6.

Further, with a surface layer portion of a portion of the n-type body layer 3 located between the $p^+$-type source region 4 and the p-type drift layer 2, that is, a portion of the p-type body layer 3 which is in contact with the trench 6 as a channel region, a gate insulating film 7 is formed on an inner wall surface of the trench 6 including the channel region. A gate electrode 8 made of doped poly-Si is formed on a surface of the gate insulating film 7, and the trench 6 is filled with the gate insulating film 7 and a gate electrode 8.

In the above manner, the trench gate structure in which the gate insulating film 7 and the gate electrode 8 are disposed in the trench 6 is configured. The trench gate structure extends with the direction perpendicular to the paper plane in FIG. 1 as a longitudinal direction, and the multiple trench gate structures are aligned in a lateral direction of FIG. 1 into stripes. The p$^+$-type source region 4 and the n-type body layer 3 described above also have a layout structure to extend along the longitudinal direction of the trench gate structure.

The source electrode 9 and a gate wire not shown are formed on the surfaces of the p$^+$-type source region 4 and the n-type body layer 3, and the surface of the gate electrode 8. The source electrode 9 and the gate wire are made of multiple metals, for example, Ni/Al or the like. A portion of the multiple metals which comes in contact with at least p-type diamond, specifically, the p$^+$-type source region 4 is made of a metal that can come in ohmic contact with the p-type diamond. A portion of the multiple metals which comes in contact with at least n-type diamond, specifically, the n-type body layer 3 is made of a metal that can come in ohmic contact with the n-type diamond. The source electrode 9 and the gate wire are formed on an interlayer insulating film 10, and electrically isolated from each other. Through contact holes provided in the interlayer insulating film 10, the source electrode 9 is brought into electric contact with the p$^+$-type source region 4 and the n-type body layer 3, and the gate wire is brought into electric contact with the gate electrode 8.

Further, a drain electrode 11 is formed on a back surface side of the p$^+$-type substrate 1, and the drain electrode 11 is electrically connected to the p$^+$-type substrate 1. With the structure described above, the semiconductor device provided with the vertical MISFET 100 having the inverted trench gate structure of the p-channel type is configured.

Figure 2:
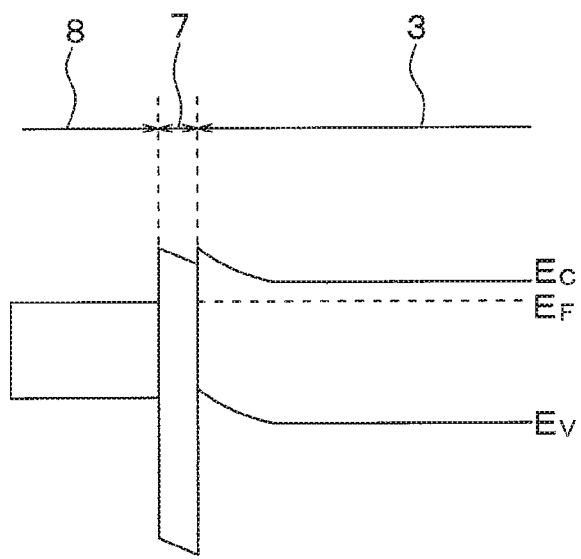
FIG. 2 is a diagram showing an energy band structure on a line II-II in FIG. 1.
Figure 3:
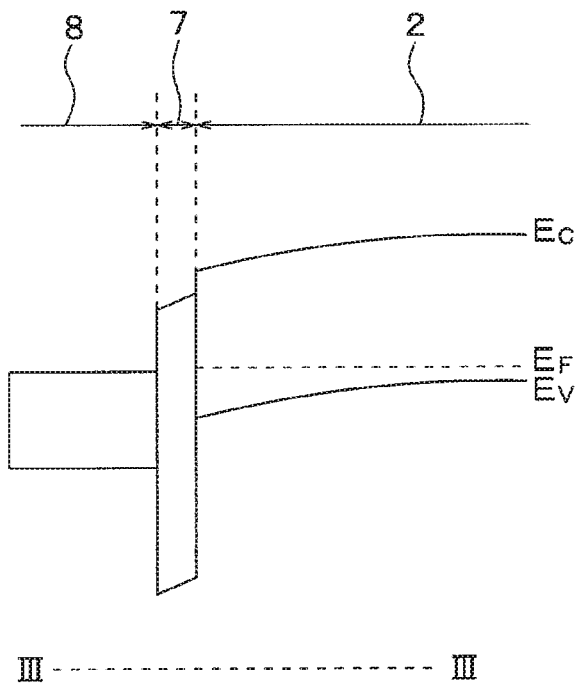
FIG. 3 is a diagram showing an energy band structure on a line III-III in FIG. 1.

In the structure described above, in the present embodiment, the gate insulating film 7 is made of a material having a larger dielectric constant than that of the n-type diamond or p-type diamond used as the wide gap semiconductor. For example, the gate insulating film 7 is formed of any one layer or a laminate of multiple layers of Al$_2$O$_3$, HfSiO, HfO, HfO2, HfAlON, and Y$_2$O$_3$, or one layer or a laminate of multiple layers of those insulating films whose composition ratios of elements are changed. With the gate insulating film 7 configured described above, the gate insulating film 7 has a barrier against the minority carriers of the n-type body layer 3 and has no barrier against the minority carriers of the p-type drift layer 2. For example, an energy band structure of the MIS gate on a line II-II in FIG. 1, that is, a portion from the gate electrode 8 to the n-type body layer 3 through the gate insulating film 7 is in a state shown in FIG. 2. In other words, the gate insulating film 7 has a barrier against migration of the minority carriers of the n-type body layer 3, in this example, the holes, from the gate electrode 8 side to the n-type body layer 3. In addition, the energy band structure of the MIS gate on a line III-III in the drawing, that is, a portion from the gate electrode 8 to the p-type drift layer 2 through the gate insulating film 7 is in a state shown in FIG. 3. In other words, the gate insulating film 7 has no barrier of the migration of the minority carriers of the p-type drift layer 2, in this example, electrons, from the gate electrode 8 side to the n-type body layer 3.

Figure 6:
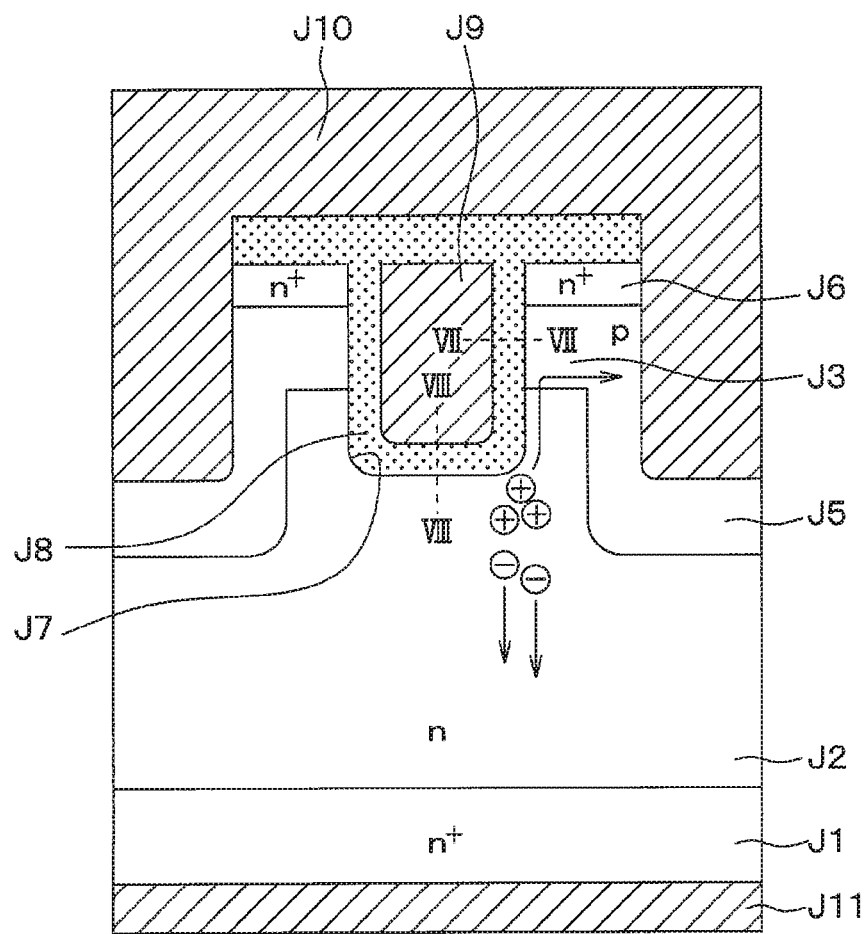
FIG. 6 is a cross-sectional view of a semiconductor device made of a wide gap semiconductor shown as a reference example.
Figure 7:
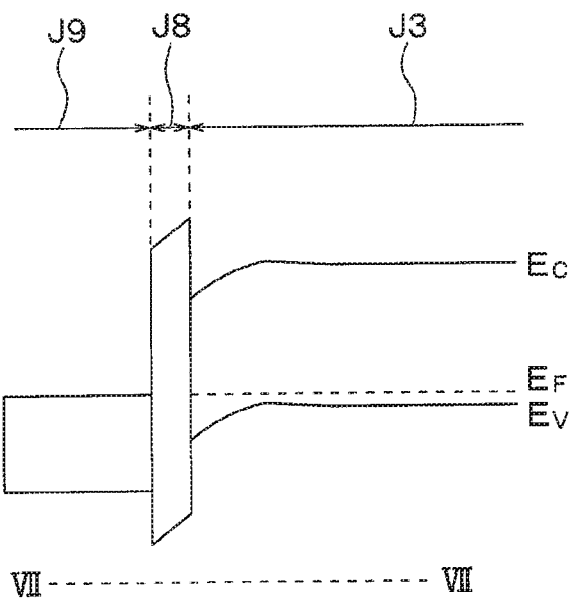
FIG. 7 is a diagram showing an energy band structure on a line VII-VII in FIG. 6.
Figure 8:
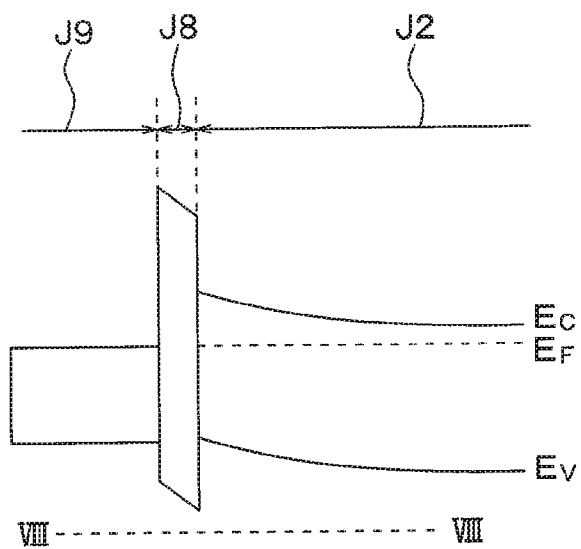
FIG. 8 is a diagram showing an energy band structure on a line VIII-VIII in FIG. 6.

As a reference, in the conventional vertical MISFET made of SiC shown in FIG. 6, the energy band structure of the MIS gate on a line VII-VII in FIG. 6, that is, a portion from the gate electrode J9 to the p-type body layer J3 through the gate insulating film J8 is in a state shown in FIG. 7. In other words, the gate insulating film J8 has a barrier against the migration of the minority carriers of the p-type body layer J3, in this example, the electrons, from the gate electrode J9 side to the p-type body layer J3. In addition, the energy band structure of the MIS gate on a line VIII-VIII in the drawing, that is, a portion from the gate electrode J9 to the n-type drift layer J2 through the gate insulating film J8 is in a state shown in FIG. 8. In other words, the gate insulating film J8 has a barrier against the migration of the minority carriers of the n-type drift layer J2, in this example, the holes, from the gate electrode J9 side to the p-type body layer J3.

Next, the operation of the vertical MISFET 100 having the inverted trench gate structure in the semiconductor device configured as described above will be described.

In the vertical MISFET 100, when a gate voltage is applied to the gate electrode 8, a channel is provided on a surface of the n-type body layer 3 which is in contact with the trench 6. As a result, holes injected from the drain electrode 11 pass through the channel provided in the n-type body layer 3 from the p$^+$-type substrate 1 and the p-type drift layer 2, then reach the p-type drift layer 2, and cause a current to flow between the source electrode 9 and the drain electrode 11.

On the other hand, during turn-off, since a dielectric constant of the gate insulating film 7 is set to be higher than that of the diamond forming the semiconductor layer of each portion, the electric field intensity in the gate insulating film 7 is reduced. For that reason, the reliability of the gate insulating film 7 can be improved.

In addition, in the case where the drain voltage increases and the avalanche breakdown occurs during turn-off, the avalanche occurs at the position of a tip of the gate electrode 8 in the p-type drift layer 2. At that time, since the gate insulating film 7 has no barrier, the electron current generated by the avalanche does not flow in a base of a parasitic pnp transistor formed by the p$^+$-type source region 4, the n-type body layer 3 and the p-type drift layer 2, and flows in the gate electrode 8. This makes it possible to prevent the parasitic pnp transistor from being turned on, resulting in an improvement in the blocking resistance of the vertical MISFET 100.

Furthermore, when an electron current flows through the gate electrode 8, since the gate electrode 8 per se has resistance, a gate potential rises due to the electron current, a channel is provided in the n-type body layer 3 on the side surface of the trench gate structure, and a gate of the vertical MISFET 100 is turned on. When the gate is turned on, the drain voltage decreases, and therefore avalanche is reduced. In other words, when avalanche occurs, the vertical MISFET 100 can be prevented from being destroyed by shifting to an on state.

In this way, a material having a barrier against the minority carriers of the n-type body layer 3 and having no barrier against the minority carriers of the p-type drift layer 2 is selected as the material of the gate insulating film 7. As a result, as described above, the blocking resistance can be improved while securing the reliability of the gate insulating film 7. Since those effects can be obtained without providing the p-type deep layer J5 unlike the conventional structure shown in FIG. 6, JFET parasitically formed due to provision of the p-type deep layer J5 can be eliminated. Therefore, the JFET resistance $R_{JFET}$ can be eliminated, and a lower limit value of the total resistance value $R_{TOTAL}$ can be further reduced.

Therefore, in the semiconductor device using the wide gap semiconductor, a reduction in a conduction loss can be performed while realizing an improvement in blocking resistance and the securing of reliability of the gate insulating film.

As a reference, in the case of the vertical MISFET of the conventional structure shown in FIG. 6, the gate insulating film J8 has a barrier against the migration of the minority carriers of the n-type drift layer J2 from the gate electrode J9 side to the p-type body layer J3. For that reason, if the p-type deep layer J5 is not formed, when avalanche occurs, holes flow in a path indicated by an arrow in FIG. 6 and the parasitic NPN transistor turns on, as a result of which the current concentrates on a place turned on and leads to destruction.

When the vertical MISFET 100 configured as described above is applied as a switching element provided on upper and lower arms of an inverter or the like, it is preferable to prevent the diode from being turned on without the use of the diode in a diode mode. In other words, when the electrons pass through the gate electrode 8 in a reverse recovery mode, the vertical MISFET 100 is turned on, and the short circuit of upper and lower arms occur. In order to prevent the short circuit, there is a need to use reflux diode (hereinafter referred to as FWD) separately without the use of a body diode formed by a PN junction between the p-type drift layer 2 and the n-type body layer 3 as the diode mode. In that case, there is a need to set a forward voltage Vf when the FWD is turned on to be smaller than a built-in voltage of the body diode, as a result of which the FWD can be turned on preferentially over the body diode.

As described above, in the present embodiment, the gate insulating film 7 is made of the material having the barrier against the minority carriers of the n-type body layer 3 and having no barrier against the minority carriers of the p-type drift layer 2. As a result, in the semiconductor device using the wide gap semiconductor, a reduction in a conduction loss can be performed while realizing an improvement in blocking resistance and the securing of reliability of the gate insulating film.

Second Embodiment

A second embodiment will be described. In the present embodiment, a circuit including the semiconductor device described in the first embodiment will be described. Since a basic configuration of the semiconductor device is the same as that of the first embodiment, only circuit portions different from the first embodiment will be described.

Figure 4:
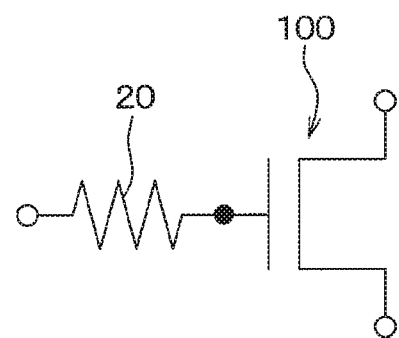
FIG. 4 is a diagram showing a configuration of a circuit including a semiconductor device according to a second embodiment.

As shown in FIG. 4, in the circuit including the semiconductor device according to the present embodiment, a gate resistor 20 is connected to a gate of a vertical MISFET 100. In this manner, the gate resistor 20 is connected to the gate of the vertical MISFET 100, thereby being capable of preventing an excessive large current from flowing through a gate electrode 8. Therefore, the vertical MISFET 100 is turned on by a small amount of gate current, and the gate electrode 8 can be protected.

The gate resistor 20 referred to this example can be set as an external resistor, but may be a built-in resistor of the semiconductor device. When the gate resistor 20 is the built-in resistor, a circuit including the semiconductor device described in the present embodiment can be configured in the semiconductor device.

Third Embodiment

A third embodiment will be described. Similarly, in the present embodiment, a circuit including the semiconductor device described in the first embodiment will be described. The basic configuration of the semiconductor device is the same as that of the first embodiment. Further, the circuit is also provided with the gate resistor 20 described in the second embodiment. Therefore, only portions of the present embodiment different from the first and second embodiments will be described.

Figure 5:
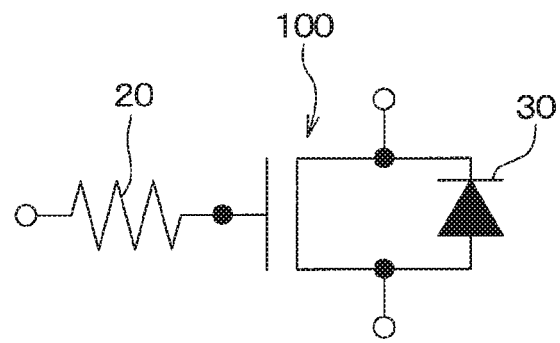
FIG. 5 is a diagram showing a configuration of a circuit including a semiconductor device according to a third embodiment.

As shown in FIG. 5, in the circuit including the semiconductor device according to the present embodiment, a FWD 30 is connected between the source and the drain of a vertical MISFET 100. The circuit is applied, for example, in a case in which the vertical MISFET 100 is applied as a switching element provided on upper and lower arms of an inverter or the like.

The FWD 30 is an external diode component, and the forward voltage Vf is set to be smaller than the built-in voltage of the body diode due to the PN junction between a p-type drift layer 2 and an n-type body layer 3 in the vertical MISFET 100.

With the FWD 30 configured as described above, the FWD 30 can be turned on preferentially over the body diode at the time of turning off. Therefore, the body diode can be prevented from being turned on. For that reason, electrons can be prevented from coming out of a gate electrode 8 in a reverse recovery mode, thereby being capable of preventing the vertical MISFET 100 from turning on and causing the short circuit of the upper and lower arms.

Other Embodiments

Although the present disclosure has been described in accordance with the embodiments described above, the present disclosure is not limited to the above embodiments, but encompasses various modifications and modifications within the equivalent scope. In addition, it should be understood that various combinations or aspects, or other combinations or aspects, in which only one element, one or more elements, or one or less elements are added to the various combinations or aspects, also fall within the scope or technical idea of the present disclosure.

For example, in the respective embodiments described above, diamond has been described as an example of the wide gap semiconductor. Alternatively, a semiconductor device using another wide gap semiconductor, for example, SiC or the like may be used.

Further, in the respective embodiments described above, the p-type drift layer 2 is formed on the surface of the $p^+$-type substrate 1 as the semiconductor substrate whose back surface side is a back surface layer of the high concentration impurity, and whose front surface side is a drift layer having the impurity concentration lower than that of the back surface layer. However, the above configuration is merely an example of the semiconductor substrate. For example, the semiconductor substrate may configure the back surface layer by ion-implanting the p-type dopant on the back surface side of the substrate configured by the p-type drift layer 2, or epitaxial growth.

Also, in the respective embodiments described above, the MISFET of the p-channel type in which the first conductivity type is p-type, and the second conductivity type is n-type has been described as an example. Alternatively, the present disclosure can be applied to an MISFET of the n-channel type in which the conductivity type of the respective components is reversed.

The invention claimed is:

1. A semiconductor device with a wide gap semiconductor, comprising:
a vertical MISFET including:
a semiconductor substrate that includes
a back surface layer having a first conductivity type, arranged on a back surface side, and made of the wide gap semiconductor with a high impurity concentration and
a drift layer having the first conductivity type, arranged on a front surface side, and made of the wide gap semiconductor with a lower impurity concentration than that of the back surface layer;
a body layer having a second conductivity type, arranged over the drift layer, and made of the wide gap semiconductor;
a source region having the first conductivity type, arranged in an upper layer portion of the body layer, and made of the wide gap semiconductor having a higher impurity concentration than that of the drift layer;
a trench gate structure that is arranged in a trench disposed from a surface of the source region to a depth deeper than the body layer, and includes a gate insulating film arranged on an inner wall surface of the trench and a gate electrode arranged on the gate insulating film;
a source electrode that is electrically connected to the source region;
a drain electrode that is electrically connected to the back surface layer of the semiconductor substrate on the back surface side; and
an interlayer insulating film sandwiched between the source electrode and the gate electrode in a depth direction of the trench, the source region being formed between the interlayer insulating film and the body layer,
wherein:
the gate insulating film is made of a material having a barrier against a minority carrier in the body layer and having no barrier against a minority carrier in the drift layer, and
the gate insulating film directly contacts the drift layer.

2. The semiconductor device according to claim 1, wherein:
the gate insulating film is made of the material having a dielectric constant larger than the wide gap semiconductor.

3. The semiconductor device according to claim 1, wherein:
the first conductivity type is p-type;
the second conductivity type is n-type; and
the wide gap semiconductor is diamond.

4. A circuit comprising:
the semiconductor device according to claim 1, wherein:
a gate resistor is connected to the gate electrode.

5. The circuit comprising the semiconductor device according to claim 4, further comprising:
a reflux diode arranged between the source electrode and the drain electrode.

6. A circuit comprising:
the semiconductor device according to claim 1,
the circuit further comprising:
a reflux diode arranged between the source electrode and the drain electrode.

7. The semiconductor device according to claim 1, wherein:
the gate insulating film is formed of at least $HfO_2$.

8. The semiconductor device according to claim 1, wherein:
the gate insulating film directly contacts the body layer.

9. The semiconductor device according to claim 8, wherein:
the body layer directly contacts the source electrode.

10. The semiconductor device according to claim 1, wherein:
the body layer directly contacts the source electrode.

11. The semiconductor device according to claim 1, wherein:
a part of the source electrode is formed at a position deeper than the source region in the depth direction of the trench.

12. The semiconductor device according to claim 1, wherein:
the interlayer insulating film contacts the source region.

* * * * *